United States Patent [19]

Tsui

[11] Patent Number: 5,075,744
[45] Date of Patent: Dec. 24, 1991

[54] GaAs HETEROSTRUCTURE HAVING A $GaAs_yP_{1-y}$ STRESS-COMPENSATING LAYER

[75] Inventor: Raymond K. Tsui, Phoenix, Ariz.

[73] Assignee: Motorola, Inc., Schaumburg, Ill.

[21] Appl. No.: 620,819

[22] Filed: Dec. 3, 1990

[51] Int. Cl.$^5$ .................. H01L 29/205; H01L 29/80
[52] U.S. Cl. ........................................ 357/22; 357/4; 357/16
[58] Field of Search ............................ 357/22, 4, 16

[56] References Cited

U.S. PATENT DOCUMENTS

| 4,088,515 | 5/1978 | Blakeslee et al. | 357/4 |
| 4,558,336 | 12/1985 | Chang et al. | 357/4 |
| 5,016,065 | 5/1991 | Seki et al. | 357/22 |

FOREIGN PATENT DOCUMENTS

| 0178673 | 4/1986 | European Pat. Off. | 357/16 |
| 63-284869 | 11/1988 | Japan | 357/16 |
| 1199474 | 8/1989 | Japan | 357/22 |

OTHER PUBLICATIONS

Chin et al., *J. Vac Sci. Tech.*, B8 (2) Mar./Apr. 90, pp. 364–366, "Achievement . . . Structure".
Smith et al., *IEEE Electron Device Letters*, vol. 10, No. 10, Oct. 89, "A 0.25 μm Gate-Length . . . 94 GHz", pp. 437–439.

*Primary Examiner*—Jerome Jackson, Jr.
*Attorney, Agent, or Firm*—Miriam Jackson; Joe E. Barbee

[57] ABSTRACT

A GaAs heterostructure is formed with a $GaAs_yP_{1-y}$ stress-compensating layer. The heterostructure is comprised of a GaAs substrate and $GaAs_yP_{1-y}$ stress-compensating layer formed on the GaAs substrate. The stress-compensating layer has a lattice constant less than the lattice constant of the GaAs substrate. A channel layer formed on the stress-compensating layer, has a lattice constant greater than the lattice constant of the GaAs substrate. Thus, a pseudomorphic heterostructure may be formed, with the optimum thickness and doping in the channel layer to provide for improved electrical characteristics.

14 Claims, 1 Drawing Sheet

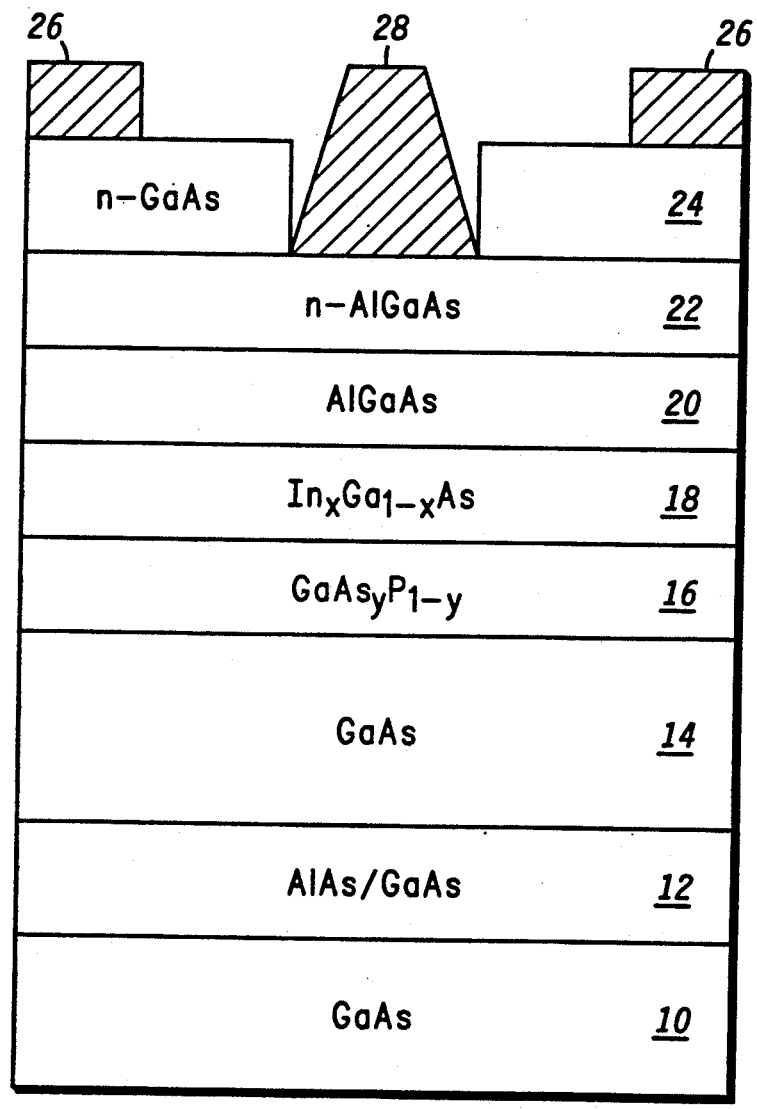

GaAs HETEROSTRUCTURE HAVING A GaAs$_y$P$_{1-y}$ STRESS-COMPENSATING LAYER

BACKGROUND OF THE INVENTION

This invention relates, in general, to GaAs heterostructure devices, and more particularly, to pseudomorphic GaAs MODFETs having a stress-compensating layer.

Pseudomorphic AlGaAs/In$_x$Ga$_{1-x}$As/GaAs MODFETs provide better high-frequency performance in Comparison to conventional AlGaAs/GaAs MODFETs. Pseudomorphic growth, or coherently strained growth of epitaxial layers on the GaAs substrate, introduces little or no misfit dislocations that degrade device performance. The high frequency and high speed performance of MODFETs improves as x increases in the In$_x$Ga$_{1-x}$As channel layer. This is due to the fact that the electron transport properties of In$_x$Ga$_{1-x}$As improve with increasing x. However, the lattice mismatch between In$_x$Ga$_{1-x}$As and GaAs increases with x. The stress and formation of misfit dislocations due to the large lattice mismatch degrades the material quality of the In$_x$Ga$_{1-x}$As channel layer, which results in a degradation of device performance. For the heterostructure to be pseudomorphic and dislocation-free, the thickness of the InxGa1-xAs channel layer has to stay below a critical value for a given x value.

A way of increasing the value of x or reducing the stress is to reduce the thickness of the channel layer, however, the channel layer can only be reduced to a certain thickness before electrical characteristics will be adversely affected. The practical channel thickness requirement sets an upper limit of x approximately equal to 0.25 for high quality devices. It would be desirable to be able to increase x without degrading electrical characteristics.

A process that would reduce the lattice mismatch strain would allow the use of higher x values. One such process entails growing a graded In$_x$Ga$_{1-x}$As layer that is thicker than the critical thickness to purposely form dislocations far enough away from the active channel region. In that case, dislocations and related defects do not degrade the properties of the active region of the channel layer. The disadvantage of this process is that a very thick In$_x$Ga$_{1-x}$As layer must be grown to keep defects away from the active channel region. Even so, there is no guarantee that the defects will not propagate to the channel. In addition, from a production point of view, the growth of a graded layer is disadvantageous, because it is less cost-effective.

An InP MODFET has been proposed by Albert Chin and T. Y. Chang in an article entitled, "Achievement of Exceptionally High Mobilities in Modulation-doped Ga$_{1-x}$In$_x$As on InP Using a Stress Compensated Structure," published in the Journal of Vacuum Science Technology, Vol. B 8(2), pp. 364–366 (1990). For the growth of In$_x$Ga$_{1-x}$As on InP substrates, the value of x that gives lattice matching is 0.53. Again, it is desirable to increase x for the enhancement of device performance, but limitations similar to those in the case of GaAs also apply. In the InP structure of Chin and Chang, an In$_{0.25}$Ga$_{0.75}$As layer is formed adjacent to the In$_x$Ga$_{1-x}$As channel layer, with x greater than 0.53 in order to compensate for stress. The lattice constant for In0.25Ga0.75As is less than the lattice constant for InP. Thus, the strain is opposite in sign to that in a layer of In$_x$Ga$_{1-x}$As with x greater than 0.53. Unfortunately, this approach of varying x in adjacent layers is not applicable for growth on GaAs substrates, because the lattice constant of In$_x$Ga$_{1-x}$As is greater than the lattice constant of GaAs for all values Of x greater than 0. InP substrates are fragile and expensive in comparison to GaAs substrates, thus, it would be desirable to improve the materials quality of pseudomorphic heterostructures on GaAs substrates to give higher device performance and reliability.

Accordingly, it is an object of the present invention is to provide an improved GaAs MODFET.

Another object of the present invention is to provide a GaAs MODFET having high frequency and high speed performance.

A further object of the present invention is to provide a GaAs MODFET having an increased mole fraction of InAs in the channel layer.

Yet another object of the present invention is to provide a pseudomorphic AlGaAs/InGaAs/GaAs MODFET having a channel layer having an optimized thickness and mole fraction of InAs and little or no misfit dislocations.

SUMMARY OF THE INVENTION

The above objects and advantages are provided by a GaAs heterostructure having a GaAs$_y$P$_{1-y}$ stress-compensating layer. The heterostructure is comprised of a GaAs substrate, a stress-compensating layer formed on the GaAs substrate, the stress-compensating layer having a lattice constant less than the lattice constant of the GaAs substrate, and a channel layer formed on the stress-compensating layer, the channel layer having a lattice constant greater than the lattice constant of the GaAs substrate.

BRIEF DESCRIPTION OF THE DRAWING

The single FIGURE illustrates an enlarged, cross-sectional view of an embodiment of the present invention in an intermediate stage of fabrication.

DETAILED DESCRIPTION OF A PREFERRED EMBODIMENT

The FIGURE illustrates an enlarged, cross-sectional view of an embodiment of the present invention in an intermediate stage of fabrication. What is shown is a semi-insulating GaAs substrate 10 having an undoped AlAs/GaAs superlattice buffer layer 12 formed thereon. GaAs substrate 10 is formed using standard crystal growing techniques well known in the art. The remaining layers are formed using deposition techniques, such as molecular beam epitaxy or metal organic vapor phase epitaxy, which are also well known in the art. The thickness of undoped AlAs/GaAs superlattice buffer layer 12 is typically approximately 1,000 angstroms. An undoped GaAs layer 14 typically of 2,000 angstroms, is thereafter formed on superlattice buffer layer 12. Undoped GaAs layer 14 and undoped AlAs/GaAs superlattice buffer layer 12 are used to obtain good underlying characteristics for an In$_x$Ga$_{1-x}$As channel layer 18 to be formed later in the process. Thus, undoped GaAs layer 14 and undoped AlAs/GaAs superlattice buffer layer 12 are not absolutely required in the present invention. An undoped GaAs$_y$P$_{1-y}$ layer 16 is subsequently formed on 25 undoped GaAs layer 14. The undoped In$_x$Ga$_{1-x}$As channel layer 18 is deposited over undoped GaAs$_y$P$_{1-y}$ layer 16.

The device is further completed by standard processing by forming a spacer layer 20, shown as an undoped AlGaAs layer in this embodiment, on $In_xGa_{1-x}As$ channel layer 18. An electron supplying layer 22, shown as an N-doped AlGaAs layer in this embodiment, and a capping layer 24, shown as N-doped GaAs layer in this embodiment, are formed on undoped AlGaAs layer 20. A portion of capping layer 24 is removed in order to form a gate metal layer 28 on electron supplying layer 22. Source and drain regions 26 are thereafter formed on capping layer 24, which provides for ohmic contact to source and drain regions 26. AlGaAs spacer layer 20, electron supplying layer 22, and capping layer 24 are not essential to the completion of the embodiment shown here to form other types of FETs, however, electron supplying layer 22 is needed in order to form a high performance MODFET.

Undoped $GaAs_yP_{1-y}$ layer 16 acts as a stress-layer compensating for every y less than 1. $GaAs_yP_{1-y}$ layer 16 acts as a stress-compensating layer because the lattice constant of $GaAs_yP_{1-y}$ layer 16 is less than the lattice constant of GaAs layer 14 or GaAs substrate 10 for y less than 1; while the lattice constant of $In_xGa_{1-x}As$ channel layer 18 is larger than the lattice constant of GaAs layer 14 or GaAs substrate 10, for any x greater than 0. $GaAs_yP_{1-y}$ layer 16 experiences a tensile strain in relation to GaAs substrate 10 in the plane parallel to the surface of GaAs substrate 10, while $In_xGa_{1-x}As$ channel layer 18 experiences a compressive strain in relation to GaAs substrate 10 in the plane parallel to the surface of GaAs substrate 10. This means that the strain in $GaAs_yP_{1-y}$ layer 16 is opposite in sign to that in $In_xGa_{1-x}As$ channel layer 18 and thus can act as a stress-compensating layer. The thickness and y of $GaAs_yP_{1-y}$ layer 16 is chosen so that a pseudomorphic $GaAs_yP_{1-y}$ layer is formed.

In order for the $GaAs_yP_{1-y}$ layer 16 to be a direct bandgap layer, y must be greater than 0.55. However, applications where carrier transport and/or optical recombination in undoped $GaAs_yP_{1-y}$ layer 16 are such that a direct bandgap layer is not required, a value of y less than 0.55 may also be used. With the use of undoped $GaAs_yP_{1-y}$ layer 16, x may be greater than 0.25 in $In_xGa_{1-x}As$ channel layer 18 without having to compromise the thickness of this layer for device applications. Note that a graded $GaAs_yP_{1-y}$ layer 16 may be formed, however, it is not preferable from a manufacturing standpoint because it complicates the process.

As can be seen, the choice of thickness and the value of x of $In_xGa_{1-x}As$ channel layer 18 is now less restricted by lattice mismatch considerations. Higher values of x can be chosen for enhanced transport properties. In addition, the conduction band discontinuity between $In_xGa_{1-x}As$ channel layer 18 and $GaAs_yP_{1-y}$ layer 16 is also significantly larger. This gives better electron confinement within $In_xGa_{1-x}As$ channel layer 18 and thus improves device characteristics to provide a GaAs MODFET having high frequency and high speed performance.

I claim:

1. A GaAs heterostructure having a stress-compensating layer, comprising:
   a GaAs substrate, having a lattice constant;
   a stress-compensating layer formed on the GaAs substrate, wherein the stress-compensating layer is comprised of $GaAs_yP_{1-y}$, where y is less than 1, and has a lattice constant less than the lattice constant of the GaAs substrate; and
   a $In_xGa_{1-x}As$ channel layer formed on the stress-compensating layer, wherein the $In_xGa_{1-x}As$ channel layer has a lattice constant greater than the lattice constant of the GaAs substrate.

2. The GaAs heterostructure of claim 1 wherein the thickness and y of the $GaAs_yP_{1-y}$ layer is chosen so that a pseudomorphic $GaAs_yP_{1-y}$ layer is formed.

3. The GaAs heterostructure of claim 1 wherein the thickness and x of the $In_xGa_{1-x}As$ channel layer is chosen so that a pseudomorphic GaAs heterostructure is formed.

4. The GaAs heterostructure of claim 1 further comprising:
   an AlAs/GaAs buffer layer formed on the GaAs substrate; and
   a GaAs layer formed on the AlAs/GaAs buffer layer so that the stress-compensating layer is on the GaAs layer.

5. The GaAs heterostructure of claim 1 further comprising:
   an AlAs/GaAs buffer layer formed on the GaAs substrate;
   a GaAs layer formed on the AlAs/GaAs buffer layer so that the stress-compensating layer is on the GaAs layer;
   a spacer layer formed on the $In_xGa_{1-x}As$ channel layer;
   an electron supplying layer formed on the spacer layer; and
   a capping layer formed on the electron supplying layer.

6. The GaAs heterostructure of claim 1 further comprising:
   an AlAs/GaAs buffer layer formed on the GaAs substrate;
   an undoped GaAs layer formed on the AlAs/GaAs buffer layer so that the stress-compensating layer is on the undoped GaAs layer;
   an undoped AlGaAs layer formed on the $In_xGa_{1-x}As$ channel layer;
   an n-type AlGaAs layer formed on the undoped AlGaAs layer; and
   an n-type GaAs layer formed on the n-type AlGaAs layer.

7. The GaAs heterostructure of claim 1 wherein y is less than or equal to 0.55.

8. A GaAs heterostructure having a stress-compensating layer, comprising:
   a GaAs substrate, having a lattice constant;
   a stress-compensating layer formed on the GaAs substrate, wherein the stress-compensating layer is comprised of $GaAs_yP_{1-y}$, where y is less than 1, and the stress-compensating layer experiences a tensile strain in relation to the GaAs substrate in the plane parallel to the surface of the GaAs substrate; and
   an $In_xGa_{1-x}As$ channel layer formed on the stress-compensating layer, wherein the $In_xGa_{1-x}As$ channel layer experiences a compressive strain in relation to the GaAs substrate in the plane parallel to the surface of the GaAs substrate.

9. The GaAs heterostructure of claim 8 wherein the thickness and y of the $GaAs_yP_{1-y}$ layer is chosen so that a pseudomorphic $GaAs_yP_{1-y}$ layer is formed.

10. The GaAs heterostructure of claim 8 wherein the thickness and x of the $In_xGa_{1-x}As$ channel layer is chosen so that a pseudomorphic GaAs heterostructure is formed.

11. A GaAs heterostructure having a stress-compensating layer, comprising:

a GaAs substrate, having a lattice constant;

a $GaAs_yP_{1-y}$ layer formed on the GaAs substrate, where y is less than or equal to 0.55, the $GaAs_yP_{1-y}$ layer having a strain; and a $In_xGa_{1-x}As$ channel layer formed on the $GaAs_yP_{1-y}$ layer, the $In_xGa_{1-x}As$ channel layer having an opposite strain to that of the $GaAs_yP_{1-y}$ layer.

12. The GaAs heterostructure of claim 11 wherein the thickness and y of the $GaAs_yP_{1-y}$ layer is chosen so that a pseudomorphic $GaAs_yP_{1-y}$ layer is formed.

13. The GaAs heterostructure of claim 11 wherein the thickness and x of the $In_xGa_{1-x}As$ channel layer is chosen so that a pseudomorphic GaAs heterostructure is formed.

14. The GaAs heterostructure of claim 11 wherein the thickness of the $In_xGa_{1-x}As$ channel layer is below a critical thickness so that a pseudomorphic GaAs heterostructure is formed.

* * * * *

UNITED STATES PATENT AND TRADEMARK OFFICE
CERTIFICATE OF CORRECTION

PATENT NO. : 5,075,744
DATED : December 24, 1991
INVENTOR(S) : Raymond K. Tsui

It is certified that error appears in the above-indentified patent and that said Letters Patent is hereby corrected as shown below:

Column 4, claim 1, line 2, delete "lnxGa1 xAs" and insert therefor --"$In_x Ga_{1-x} As$"--.

Column 4, claim 8, line 58, delete "$ln_x Ga_{1-x} As$" and insert therefor --"$In_x Ga_{1-x} As$"--.

Column 6, claim 13, line 5, delete "Of" and insert therefor --"of"--.

Column 6, claim 13, line 5, delete "iS" and insert therefor --"is"--.

Signed and Sealed this

Eleventh Day of October, 1994

Attest:

BRUCE LEHMAN

*Attesting Officer*  *Commissioner of Patents and Trademarks*